United States Patent [19]
Estrada

[11] Patent Number: 6,111,431
[45] Date of Patent: Aug. 29, 2000

[54] LVDS DRIVER FOR BACKPLANE APPLICATIONS

[75] Inventor: Julio Ricardo Estrada, South Portland, Me.

[73] Assignee: National Semiconductor Corporation, Santa Clara, Calif.

[21] Appl. No.: 09/078,776

[22] Filed: May 14, 1998

[51] Int. Cl.$^7$ .................................................. H03K 19/0175
[52] U.S. Cl. .................................................. 326/83; 326/86
[58] Field of Search .................................. 326/83, 86, 30; 227/560, 561, 562, 563, 566, 564, 565

[56] References Cited

U.S. PATENT DOCUMENTS

| | | | |
|---|---|---|---|
| 4,084,070 | 4/1978 | Reed et al. ................................. | 178/69 |
| 4,791,314 | 12/1988 | Kuo et al. ................................. | 307/270 |
| 4,845,386 | 7/1989 | Uneo ........................................ | 307/446 |
| 4,884,165 | 11/1989 | Kong et al. ............................... | 361/98 |
| 4,987,318 | 1/1991 | Burke et al. ............................. | 307/443 |
| 5,404,051 | 4/1995 | Kobayashi ................................ | 327/170 |
| 5,444,446 | 8/1995 | Gopinathan et al. ..................... | 341/135 |
| 5,519,728 | 5/1996 | Kuo ......................................... | 375/257 |
| 5,530,271 | 6/1996 | Fallica ..................................... | 257/173 |
| 5,576,634 | 11/1996 | Kamiya .................................... | 326/26 |
| 5,604,417 | 2/1997 | Kaminaga et al. ....................... | 320/17 |
| 5,614,848 | 3/1997 | Kaminaga et al. ....................... | 326/110 |
| 5,632,019 | 5/1997 | Masiewicz ............................... | 395/250 |
| 5,880,599 | 3/1999 | Bruno ...................................... | 326/56 |

*Primary Examiner*—Michael Tokar
*Assistant Examiner*—Anh Tran
*Attorney, Agent, or Firm*—Limbach & Limbach L.L.P.

[57] ABSTRACT

A low voltage differential signal ("LVDS") line driver circuit includes a driver cell and a mimicking circuit. The driver cell includes a current sourcing transistor which provides a drive current to a current steering circuit. In response to first and second input signals, the current steering circuit provides a differential output signal. Each transistor of the driver cell and the resistive load driven by the LDVS line driver is replicated by the mimicking circuit to maintain a high output voltage reference signal and a low output voltage reference signal. A first operational amplifier couples to the current sourcing transistor and compares the high output voltage reference signal with a high output voltage signal of the differential output signal. When the high output voltage signal either exceeds or falls below the high output voltage reference signal, the first operational amplifier controls the sourcing transistor to supply enough current to the current steering circuit to maintain a desired offset voltage. A second operational amplifier couples to the current sinking transistor and compares the low output voltage reference signal with the low output voltage signal of the differential output signal. When the low output voltage signal either exceeds or falls below the low output voltage reference signal, the second operational amplifier controls the current sinking transistor to sink current from the current steering circuit to maintain the desired offset voltage. The mimicking circuit also includes an operational amplifier to maintain the desired offset voltage.

14 Claims, 7 Drawing Sheets

LVDS DRIVER FOR BACKPLANE APPLICATIONS

BACKGROUND OF THE INVENTION

1. Technical Field of the Invention

The present invention relates to the field of transistor driver circuits and in particular, to a low voltage differential signal driver for backplane applications.

2. Description of the Related Art

The constant need to transfer more information faster, accompanied by increases in data processing capability, necessitated an expansion to data transfer rates considerably higher than what was previously possible. As a consequence, a protocol referred to as 100 Base-T was developed for extending IEEE Standard 802.3 to accommodate data moving at an effective transfer rate of 100 Mbps through twisted-pair cables. Under the 100 Base-T protocol, certain control bits are incorporated into the data before it is placed on a twisted-pair cable. The result is that the data and control signals actually move through a twisted-pair cable at 125 Mbps.

One type of data transmission is differential data transmission in which the difference in voltage levels between two signal lines form the transmitted signal. Differential data transmission is commonly used for data transmission rates greater than 100 Mbps over long distances. Noise signals shift the ground level voltage and appear as common mode voltages. Thus, the deleterious effects of noise are substantially reduced.

To standardize such data transmission various standards have been promulgated. For example, one such standard is the recommended standard 422, RS422, which is defined by the Electronics Industry of America, EIA. This standard permits data rates up to 10 million baud over a twisted pair of signal lines. Driver circuits place signals on the lines. These drivers circuits must be capable of transmitting a minimum differential signal in the range of two to three volts on the twisted pair line which typically terminates in 100 ohms of resistance.

One problem with RS422 is that the twisted line pair is often used as a bus to which multiple driver circuits, sources of signals, are attached. In one type of conventional circuit, when multiple drivers are connected to a common bus, only one driver may transmit data at a time. The remaining drivers should be in a high impedance state so as to not load the bus. Since large positive and negative common mode signals may appear at the driver output terminals connected to a bus system, the maintenance of a high impedance over a wide common mode voltage range independent of whether the driver is powered or not, is desirable.

Figure 1:
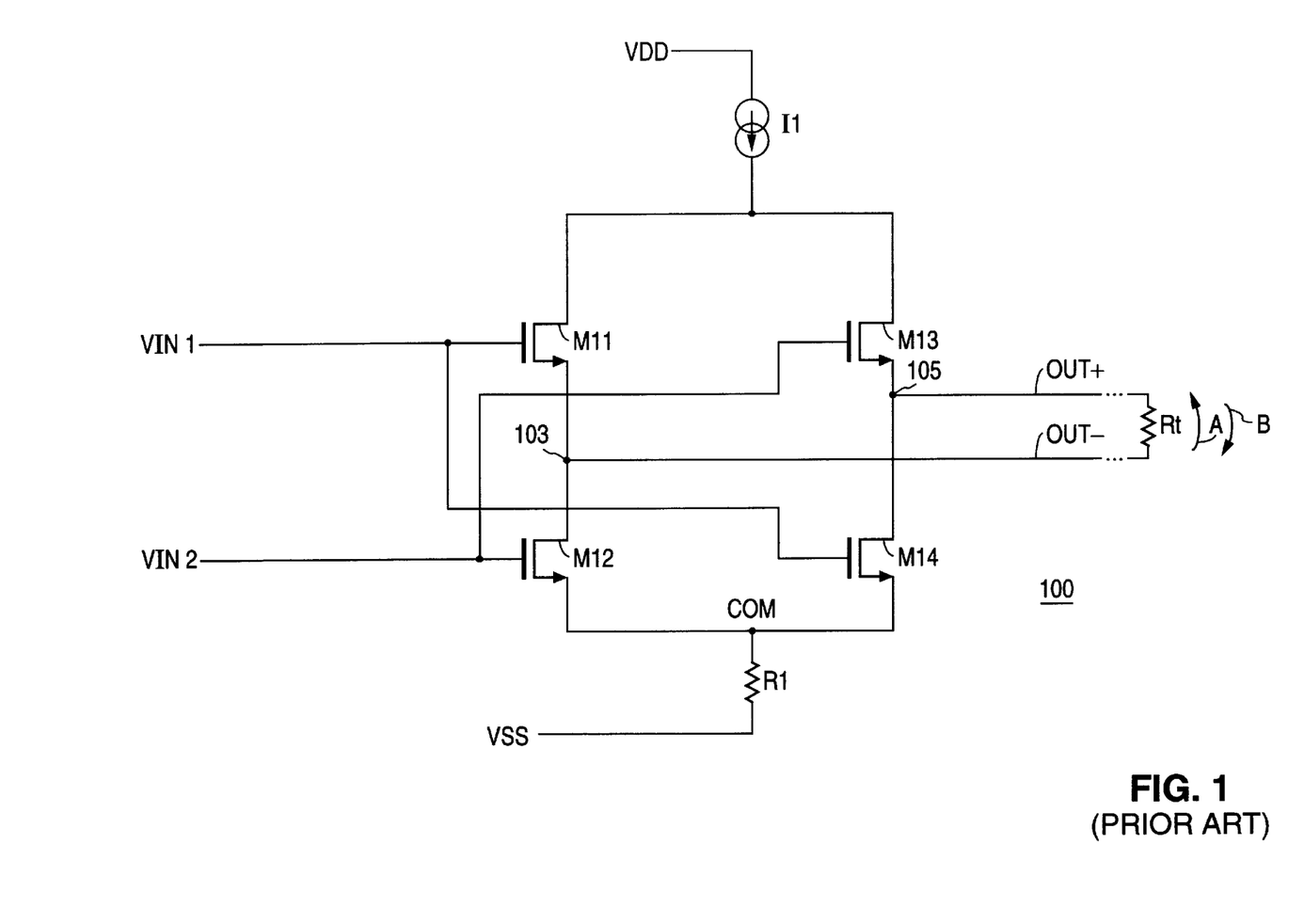
FIG. 1 illustrates a conventional low voltage differential signal driver circuit.

An example of a conventional low voltage differential signal (LVDS) driver circuit 100 is shown in FIG. 1. The difference in voltage between the output signals OUT+, OUT− on the output terminals 103, 105 form the pair of differential signals. A pair of differential signals means two signals whose current waveforms are out of phase with one another.

The LVDS driver circuit 100 includes a direct current (DC) constant current source I1 coupled to voltage supply VDD, four n-channel metal oxide semiconductor (NMOS) switches M11–M14, and a resistor R1 coupled between the common node COM and voltage supply VSS. The four transistor switches M11–M14 are controlled by input voltage signals VIN1, VIN2 and direct current through load resistor Rt as indicated by arrows A and B. The input voltage signals VIN1, VIN2 are typically rail-to-rail voltage swings.

The gates of NMOS switches M11 and M14 couple together to receive input voltage signal VIN1. Similarly, the gates of NMOS switches M12 and M13 couple together to receive input voltage signal VIN2.

Operation of the LVDS driver circuit 100 is explained as follows. Two of the four NMOS switches M11–M14 turn on at a time to steer current from current source I1 to generate a voltage across resistive load Rt. To steer current through resistive load Rt in the direction indicated by arrow A, input signal VIN2 goes high turning ON NMOS switches M12 and M13. When input signal VIN2 goes high, input signal VIN1 goes low to keep NMOS switches M11 and M14 OFF during the time NMOS switches M12 and M13 are ON. Conversely, to steer current through resistive load Rt in the direction indicated by arrow B, input signal VIN1 goes high and is applied to transistor switches M11 and M14 to make them conduct. Input signal VIN2 goes low to keep NMOS switches M12 and M13 OFF during this time. As a result, a full differential output voltage swing can be achieved.

Differential LVDS driver circuit 100 works well as long as the output voltage swing stays within the allowable common mode voltage range, usually a few volts. In general, LVDS driver circuit 100 can provide current to resistive load Rt only over some finite range of load resistance. The output voltage range over which the LVDS driver circuit 100 can function properly is known as its output compliance.

One drawback of conventional LVDS driver circuit 100 is the limited range in which to account for voltage output compliance. Typically, conventional LVDS driver circuit 100 is intended to supply a constant current from DC current source I1 to a fixed resistance of resistive load Rt. The problem often arises when LVDS driver circuit 100 connects to a backplane bus which terminates at multiple resistive loads Rt. When multiple resistive loads Rt are connected in parallel, the total resistance of resistive load Rt decreases. Since the high output voltage VOH is the voltage at the output of either output transistors M11 or M13 depending upon which switching transistor M11, M13 is conducting, this high output voltage VOH depends on the total resistance of resistive load Rt. Since the current from current source I1 is constant, when that resistance of resistive load Rt decreases, high output voltage VOH across the resistive load Rt decreases. The differential output voltage VOD is equal to high output voltage VOH less low output voltage VOL, as shown in the equation below, where low output voltage VOL is the voltage at the output of either transistor M11 or M14 depending upon which switching transistor M11, M14 is conducting.

$$VOD = VOH - VOL \qquad (1)$$

When the total resistance of resistive load Rt decreases such that the voltage across resistive load Rt falls below the minimum tolerance level of high output voltage VOH, the differential output voltage signal VOD will be too small and therefore difficult to read. On the other hand, if the resistance of the resistive load Rt increases such that the voltage across resistive load Rt exceeds the maximum tolerance level of high output voltage VOH, LVDS driver circuit 100 can be pushed out of voltage compliance.

Another drawback of LVDS driver circuit 100 is an unbalanced output impedance. Ideally, LVDS driver circuit 100 should have zero output impedance. The DC current source I1 at the top of the LVDS driver circuit 100 has a high output impedance. In contrast, resistor R1, which typically is a small value resistor, at the bottom of the LVDS driver circuit 100 has a low impedance. This impedance mismatch causes rise and fall time mismatches for the LVDS driver circuit 100 which in turn causes power to be reflected on the bus creating undesirable noise, such as electromagnetic interference (EMI) on the common mode voltage.

Therefore, a need exists for a LVDS driver circuit that limits the output voltage drop across the resistive load and eliminates impedance mismatch.

SUMMARY OF INVENTION

A low voltage differential signaling ("LVDS") line driver in accordance with the present invention includes a driver cell and a mimicking circuit. In response to an input signal changing signal states, a current steering circuit switches the direction of a drive current to provide a differential output signal to a resistive load. Together a current sourcing circuit provides a drive current to the current steering circuit and a current sinking circuit sinks current from the current steering circuit, to maintain a desired differential output signal as well as a desired offset voltage, where the offset voltage is the average of the high output voltage and the low output voltage. The driver cell also includes a first regulating circuit coupled to the current sourcing circuit and to the current steering circuit at a first signal node, and a second regulating circuit coupled to the current sinking circuit and to the current steering circuit at a second signal node.

To maintain the desired offset voltage, the mimicking circuit couples to the first and second regulating circuits to provide first and second reference signals to each regulating circuit, respectively. The first regulating circuit compares a first node signal at the first signal node with the first reference signal and when the first node signal transcends the first reference signal, controls the current sourcing circuit to source an appropriate amount of drive current to maintain the desired offset voltage. Similarly, the second regulating circuit compares a second node signal at the second signal node with the second reference signal and when the second node signal transcends the second reference signal, controls the current sinking circuit to sink an appropriate amount of drive current to maintain the desired offset voltage.

The mimicking circuit generates a mimicking drive current which is a fraction of the drive current provided to the current steering circuit. In addition, the voltage drop across the resistive load driven by the driver cell and across each transistor of the driver cell is replicated by the mimicking circuit. In this way, the mimicking circuit maintains the values of the first and second reference signals.

The mimicking circuit also includes a third regulating circuit and two series resistors, each of which replicates half of the total resistance of the resistive load driven by the driver cell. This third regulating circuit compares the voltage at the junction of the mimicking resistors with a reference signal which corresponds to a desired offset voltage. When the voltage at the junction of these resistors transcends the reference signal, the third regulating circuit controls a mimicking sinking transistor to sink an amount of current appropriate to establish the reference signal value at the junction of the mimicking resistors. In this way, the mimicking circuit provides the desired offset voltage which can be tracked by the driver cell.

These and other features and advantages of the present invention will be understood upon consideration of the following detailed description of the invention and the accompanying drawings.

BRIEF DESCRIPTION OF THE DRAWINGS

Like reference symbols are employed in the drawings and in the description of the preferred embodiments to represent the same or similar items.

DETAILED DESCRIPTION OF THE INVENTION

Figure 2:
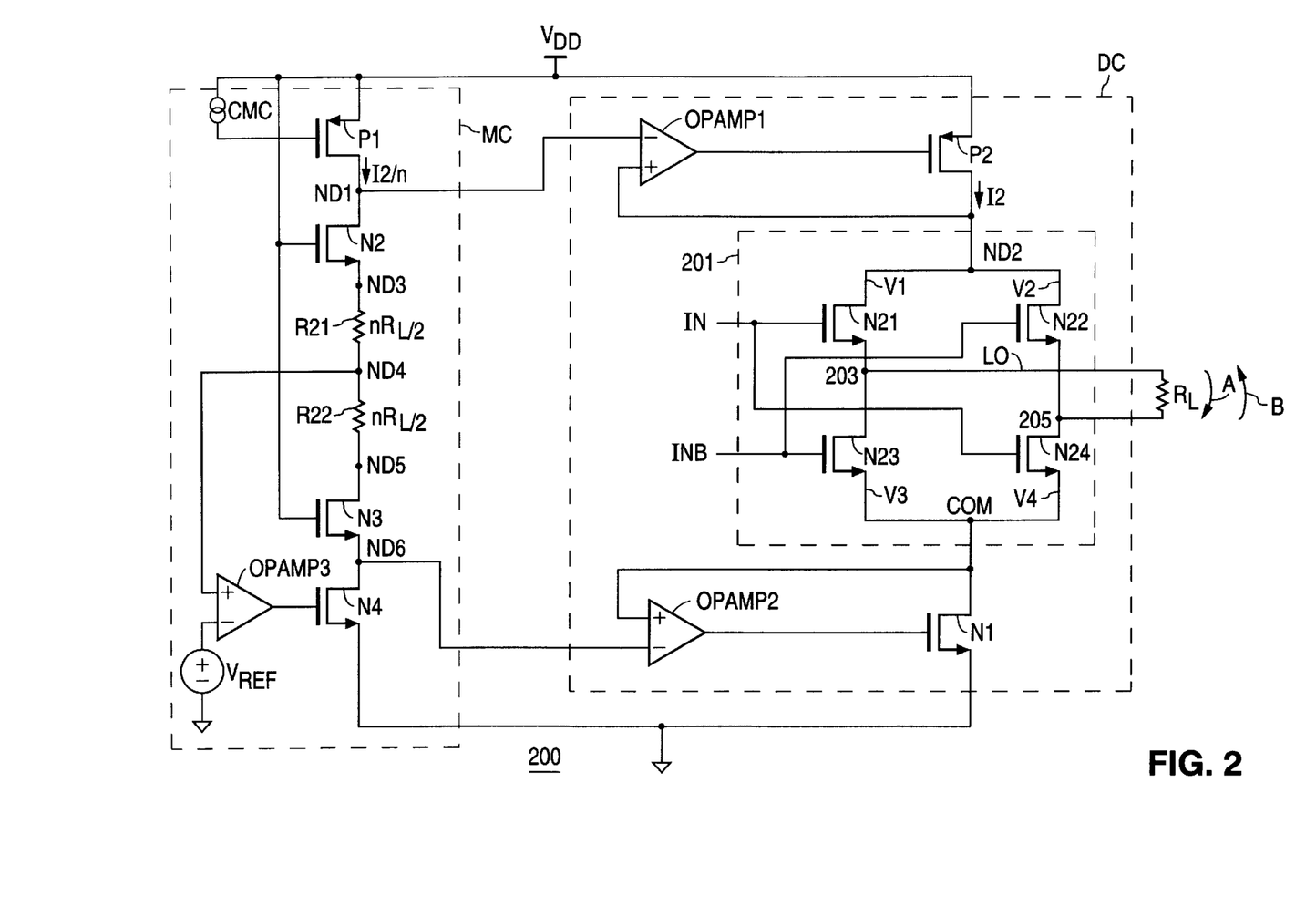
FIG. 2 illustrates a low voltage differential signal driver circuit in accordance with one embodiment of the present invention.

In accordance with an illustrative embodiment of the invention, an LVDS driver circuit 200 is shown in FIG. 2. The LVDS driver circuit 200 includes a totem-pole-type mimicking circuit MC having a totem-pole-type configuration and a driver cell DC also having a totem-pole-type configuration. Driver cell DC includes an operational amplifier OPAMP1 coupled to a P-channel metal oxide semiconductor (PMOS) P1 of mimicking circuit MC, and an operational amplifier OPAMP2 coupled to N-channel metal oxide semiconductor (NMOS) N4 of mimicking circuit MC. Driver cell DC also includes a transistor P2 that sources enough drive current I2 to establish a desired differential output voltage VOD across a resistive load RL.

In addition, driver cell DC also has a current steering circuit 201 having an H-bridge circuit configuration. A load segment LO extends horizontally and contains resistive load RL. This load segment LO couples between end nodes 203, 205. Vertical segment V1 extends between left end node 203 and node ND2. Connected between left end node 203 and common node COM is vertical segment V3. Vertical segment V2 extends between right end node 205 and node ND2, while vertical segment V4 extends between right end node 205 and common node COM. The reference to "vertical" and "horizontal" orientations of the segments of the modified H-bridge circuit 201 are, of course, merely for descriptive purposes and do not necessarily describe the actual layout of the circuit 201. Each of the vertical segments V1, V2, V3, V4 contains a respective NMOS switch N21, N22, N23, N24.

The switches N21–N24 are controlled by input signals IN, INB. These input signals IN, INB are complementary rail to rail voltage levels so the signal is either "high" or "low." In operation, these voltage signals IN, INB are applied to the gates of transistors N21–N24, to direct current from transistor P2 through a resistive load RL as indicated by arrows A and B. As used herein, the term "gate" broadly encompasses any form of control lead for changing the switching state of a device. As such, the term "gate" is intended to be synonymous with the "base" of a bipolar transistor, for example.

To steer the current from transistor P2 through load resistor RL in the direction indicated by arrow A, a high voltage level from voltage signal IN is applied to MOS switches N21 and N24 to turn these switches on, while a low voltage level from voltage signal INB is applied to MOS switches N22 and N23 to keep these switches off during this time. When the current steering circuit 201 steers the current in this direction, the voltage at output node 205 is pulled low and the voltage at the output node 203 is pulled high. Thus, since output transistor N21 is ON, the high output voltage VOH is the voltage at output node 203 and the output low voltage VOL is the voltage at output node 205.

Conversely, to direct current through resistive load RL in the direction indicated by arrow B, a high voltage level from voltage signal INB is applied to MOS switches N22 and N23 to make them conduct, while the other switches N21 and N24 are kept off during this time. When current steering circuit 201 steers the current in this direction, the voltage at output node 205 is pulled high and the voltage at the output node 203 is pulled low. Thus, since output transistor N23 is ON, the high output voltage VOH is the voltage at output node 205 and output low voltage VOL is the voltage at output node 203.

Mimicking circuit MC ensures the voltages at nodes ND2 and COM remain constant between the switching of transistors N21–N24. In this way, an offset voltage VOS defined as the average of high output voltage VOH and output low voltage VOL with respect to ground, as shown in equation (2), tracks an internal reference voltage VREF.

$$VOS=[VOH+VOL/2] \quad (2)$$

The Electronics Industry of America (EIA) 644 standard requires that the offset voltage VOS be within the range of 1125 millivolts (mV) to 1375 mV. Typically, it is desirable for the offset voltage VOS of a line driver circuit to be approximately 1200 mV to leave room for any variations, such as process and temperature variations, which may affect the offset voltage VOS.

As mentioned above, transistor P2 sources drive current I2 to establish a desired differential output voltage VOD across resistive load RL. A constant mimicking drive current I2/n, which is a fraction of the drive current I2, flows from transistor P1 through mimicking circuit MC. In an exemplary embodiment, transistor P1 is the output transistor of a current mirror circuit CMC and provides this constant current I2/n to establish a constant high output voltage reference VOHR at node ND1. Operational amplifier OPAMP1 regulates the voltage at node ND2, which is at the drain of transistor P2, to this high output voltage reference VOHR. Mimicking circuit MC also establishes a constant low output voltage reference VOLR at node ND6. Operational amplifier OPAMP2 regulates the voltage at node COM, which is at the drain of transistor N1, to this low output voltage reference VOLR.

To ensure the voltage at node ND1 is the same as that at node ND2, and that the voltage at node ND6 is the same as that at node COM, the voltage drop across each component of driver cell DC is replicated across each component of mimicking circuit MC. Since mimicking drive current I2/n is only a fraction of the drive current I2 through driver cell DC, the size or equivalent on-resistance of each transistor P1, N2, N3, N4 of mimicking circuit MC is a common fraction (1/n) of the size or on-resistance of each corresponding transistor P2, N21 and N22, N23 and N24, N1, respectively, of driver cell DC. Referring now to the top of the totem-pole-type configurations of both mimicking circuit MC and driver cell DC, the voltage drop across transistor P1 is the same as that across transistor P2, and the voltage drop across transistor N2 is the same as that across switching transistors N21 and N22. Two resistors R21, R22 mimic resistive load RL and each of these resistors R21, R22 is equal to (n*RL)/2 to ensure the voltage drop across both resistors R21, R22 is equal to the voltage drop across resistive load RL. Continuing down the totem-pole-type configurations, the voltage drop across transistor N3 is the same as that across switching transistors N23 and N24, and the voltage drop across transistor N4 is the same as that across transistor N1.

Operational amplifier OPAMP3 controls the voltage at the gate of transistor N4 such that the current flowing through totem-pole-type mimicking circuit MC provides a desired offset voltage VOS at node ND4, the junction of the two mimic resistors R21, R22. A reference voltage VREF is set to the desired offset voltage VOS, and is input into the inverting input terminal of operational amplifier OPAMP3. The voltage at node ND4 is input into the noninverting input terminal of operational amplifier OPAMP3. Operational amplifier OPAMP3 senses the difference between reference voltage VREF and the voltage at node ND4, applied at its two input terminals. When the voltage at node ND4 transcends the level of reference voltage VREF, operational amplifier OPAMP3 drives transistor N4 to sink enough current until the voltage at node ND4 is equal to reference voltage VREF. In particular, when the voltage at node ND4 exceeds reference voltage VREF, the output of operational amplifier OPAMP3 increases towards voltage supply VDD. This in turn, increases the gate-source voltage VGS of transistor N4, causing the transistor N4 to sink more current to reduce the voltage at node ND4. When the voltage at node ND4 falls below reference voltage VREF, the output of operational amplifier OPAMP3 decreases towards circuit ground. This in turn, decreases the gate-source voltage VGS of transistor N4, causing the transistor N4 to turn off and therefore sink less current to increase the voltage at node ND4.

An exemplary embodiment of LVDS line driver 200 will now be described. In this embodiment, resistive load RL has a value of 33 ohms and a desired offset voltage VOS of 1.2 volts. Therefore, reference voltage VREF is set to 1.2 volts. Typically Electronics Industry of America (EIA) 644 standards requires the total voltage drop across RL to be approximately 300 mV regardless of the value of resistive load RL. Therefore, in this exemplary embodiment drive current I2 supplies approximately 10 milliamps (mA) to resistive load RL. Mimicking circuit MC is designed to conduct a mimicking drive current I2/n, which is one-tenth the amount of drive current I2. Therefore, in this example n equals 10, and mimicking drive current I2/10 is approximately 1 mA. In addition, transistor P1 of mimicking circuit MC is one-tenth the size of transistor P2 of driver cell DC, transistor N2 is one-tenth the size of transistors N21 and N22, transistor N3 is one-tenth the size of transistors N23 and N24, and transistor N4 is one-tenth the size of transistor N1. Resistors R21, R22 have values of (10*RL)/2 or 5RL.

In operation, when input signal IN goes from low to high, transistors N21, N24 switch on and steer drive current I2 from transistor P2 through resistive load RL in the direction indicated by arrow A. If the resistance of resistive load RL has decreased, high output voltage VOH increases which in turn causes the voltage at node ND2 to increase. When high output voltage VOH exceeds high output reference voltage VOHR, the output of operational amplifier OPAMP1 increases towards voltage supply VDD. This in turn, increases the gate-source voltage VGS of transistor P2, causing the transistor P2 to gradually turn off. As a result, transistor P2 sources less current thereby reducing the amount of drive current I2 supplied to resistive load RL. The value of high output voltage VOH will decrease until it equals high output voltage reference VOHR.

Similarly, when low voltage VOL exceeds low output reference voltage VOLR, the output of operational amplifier OPAMP1 increases towards voltage VDD. This in turn, increases the gate-source voltage VGS of transistor N1, causing the transistor N1 to sink more current from resistive load RL. The value of low output voltage VOL will decrease until it equals low output voltage reference VOLR.

On the other hand, if high output voltage VOH falls below high output voltage reference VOHR, the output of operational amplifier OPAMP1 decreases toward circuit ground. This in turn, decreases the gate-source voltage VGS of transistor P2 causing the transistor to source more current. As a result, transistor P2 supplies more drive current I2 to resistive load RL. The value of high output voltage VOH will increase until it equals high output voltage reference VOHR.

Similarly, when low voltage VOL falls below low output reference voltage VOLR, the output of operational amplifier OPAMP1 decreases towards circuit ground. This in turn, decreases the gate-source voltage VGS of transistor N1, causing the transistor N1 to sink less current from resistive load RL. The value of low output voltage VOL will increase until it equals low output voltage reference VOLR.

The ability of LVDS driver circuit 200 to regulate how much current drive current I2 is needed to establish the desired voltage across resistive load RL, is an improvement over the conventional LVDS driver circuit 100. Using such regulation, even if there are changes in resistive load RL which may have an original resistance, LVDS driver circuit 200 can tolerate variations in the resistance without going out of compliance. For example, in one embodiment the resistance of resistive load RL is 50 ohms, but LVDS driver circuit 200 can tolerate resistances between 35–70 ohms without going out of compliance. Unlike constant current source I1 of conventional LDVS driver circuit 100 (FIG. 1), operational amplifiers OPAMP1 and OPAMP2 drive transistors P2 and N1 respectively, to provide enough current to resistive load RL to maintain high output voltage VOH and low output voltage VOL at voltage reference levels VOHR and VOLR, respectively. Therefore, LVDS driver circuit 200 can compensate for variations in the resistance of resistive load RL to keep both differential output voltage VOD and offset voltage VOS constant.

In an exemplary embodiment, nodes ND3 and ND5 are output pins which can couple to external resistive circuits R21, R22. In this way, the resistance values of resistors R21, R22, mimicking the resistance of resistive load RL can be provided accurately.

Figure 3:
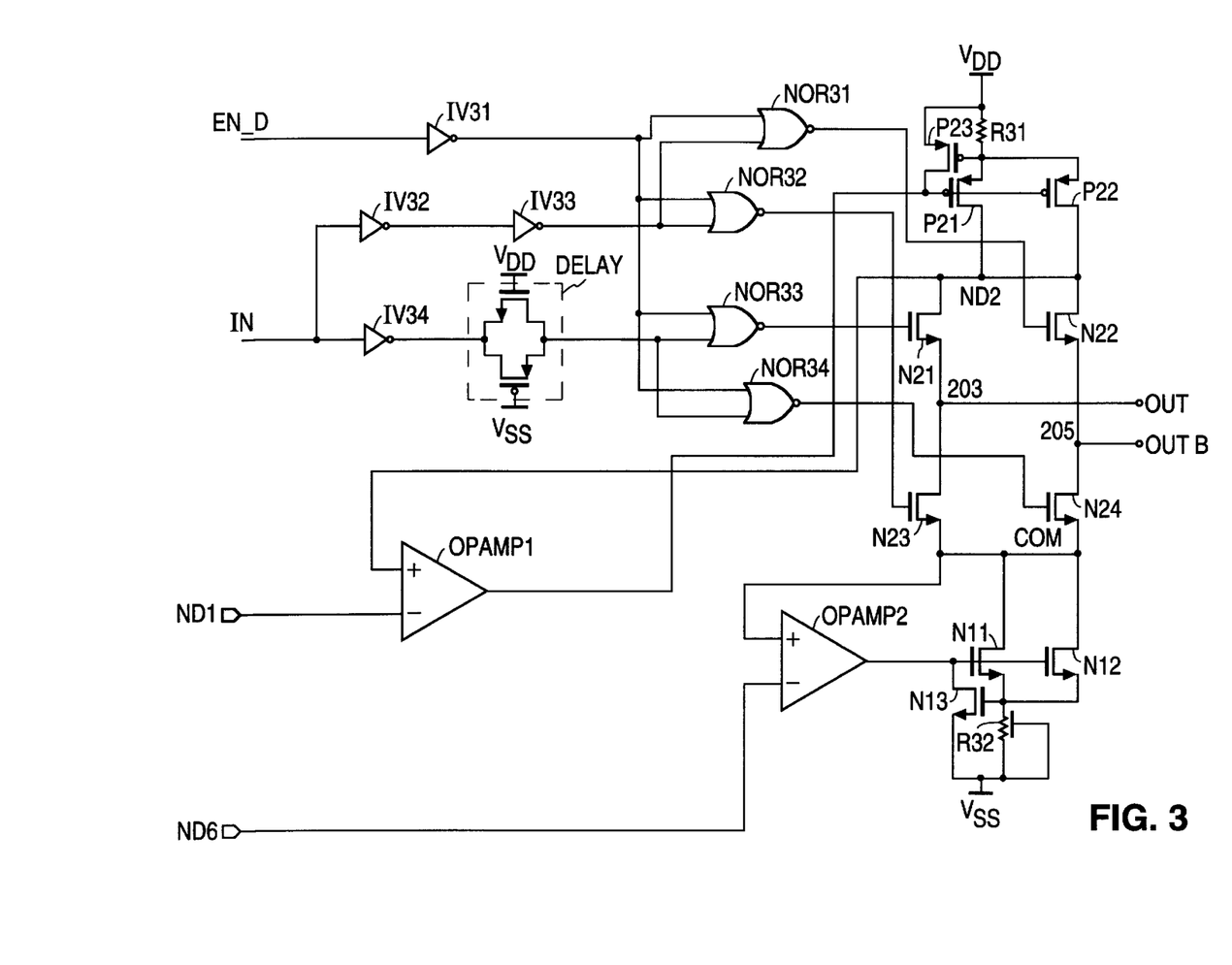
FIG. 3 illustrates a driver cell of a low voltage differential signal driver circuit in accordance with another embodiment of the present invention.

An exemplary detailed schematic diagram of driver cell DC is illustrated in FIG. 3. Transistors P21 and P22 function analogous to transistor P2 of driver cell DC illustrated in FIG. 2. Transistor P23 performs an output-to-output short-circuit current ("IOS") limiting function. In this way, if the output of LVDS driver circuit 200 is accidentally short-circuited to circuit ground, instead of damaging transistors N21, N22, the voltage across resistor R31 increases until transistor P23 turns on to reduce the gate-source voltage VGS of transistors P21, P22. This configuration ensures a safe amount of current flows through transistors P21 and P22. A similar IOS limiting function is performed by transistor N13 and resistor R32 to protect transistors N11 and N12 which function analogous to transistor N1 of driver cell DC illustrated in FIG. 2.

One input of operational amplifier OPAMP1 is connected to node ND1 having high output voltage reference VOHR signal, and the other input is connected to node ND2 to provide a feedback loop. The output of operational amplifier OPAMP1 controls the gates of transistors P21 and P22 to regulate the sourcing of drive current I2 to current steering circuit 201. Similarly, one input of operational amplifier OPAMP2 is connected to node ND6 having low output voltage reference VOLR signal and the other input is connected to node COM to provide a feedback loop. The output of operational amplifier OPAMP2 controls the gates of transistors N11 and N12 to regulate the sinking of current from current steering circuit 201. Operational amplifiers OPAMP1 and OPAMP2 may also include compensation capacitors (not shown) to prevent oscillation in operational amplifiers OPAMP1 and OPAMP2.

Switching transistors N21–N24 are controlled by enable signal EN_D and input signal IN. Enable signal EN_D is input to an inverter IV31. The output of inverter IV31 is input into one input of each NOR gate NOR31–NOR34. Input signal IN goes through delay inverters IV32–IV33 before being input to NOR gates NOR31–NOR32. Thus, when input signal IN is low and enable signal EN_D is high, the output of NOR gates NOR31–NOR32 is high and transistors N22 and N23 turn on. Input signal IN also goes through delay inverter IV34 and delay circuit DELAY before being input to NOR gates NOR33–34. Thus, when input signal IN is low and enable signal EN_D is high, the output of NOR gates NOR33–34 is high and transistors N21, N24 turn on.

Figure 4:
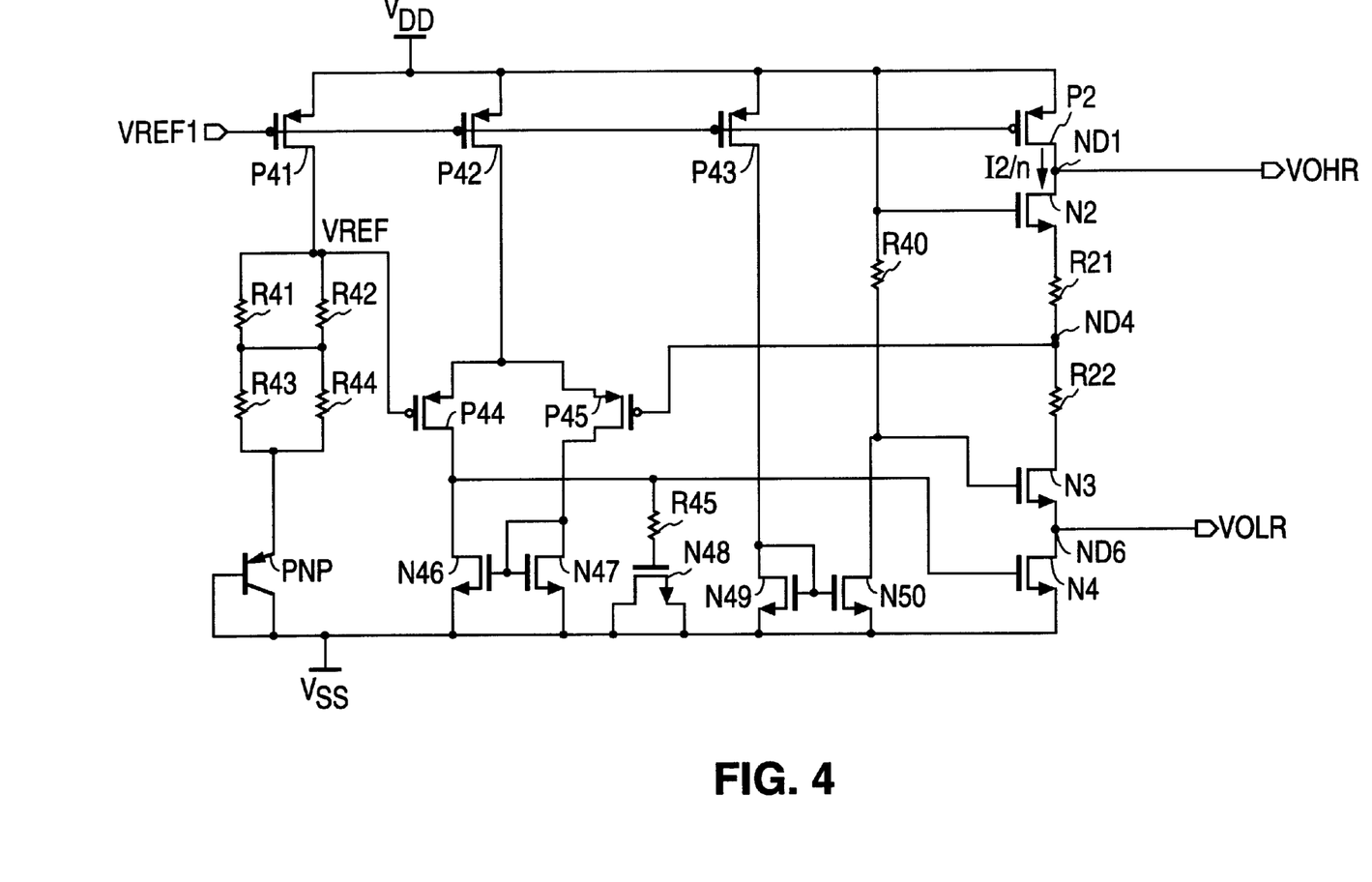
FIG. 4 illustrates a mimicking circuit of a low voltage differential signal driver circuit in accordance with still another embodiment of the present invention.

An exemplary detailed schematic diagram of mimicking circuit MC is illustrated in FIG. 4. Transistors P41–P43 and P2 are biased by a common voltage reference VREF1 to provide mimicking drive current I2/n. The pnp transistor PNP and resistors R41–R44 together provide bandgap reference voltage VREF which is constant over temperature. In one embodiment, bandgap reference voltage VREF is approximately 1.2 volts. This reference voltage VREF couples to transistor P44 which is one input to operational amplifier OPAMP3. The other input to operational amplifier OPAMP3, is transistor P45 which couples to node ND4. Transistors N46, N47 provide an active load for the differential amplifier including transistors P44 and P45. The output of operational amplifier OPAMP3 is taken from the drain of transistor P44 and is applied to the gate of transistor N4. Transistor N48 (connected as a capacitor) and resistor R45 provide a low pass filter to prevent oscillation in operational amplifier OPAMP3.

In another exemplary embodiment, transistors N49 and N50 are added to provide a current mirror sink. These transistors N49, N50 sink current through resistor R40 to provide a constant voltage drop across R40. In this way, the gate of transistor N3 is at the same voltage as the gates of switching transistors N23 and N24. Therefore, transistor N3 has the same drain-source voltage VDS and the same gate-source voltage VGS as switching transistors N23 and N24.

Figure 5:
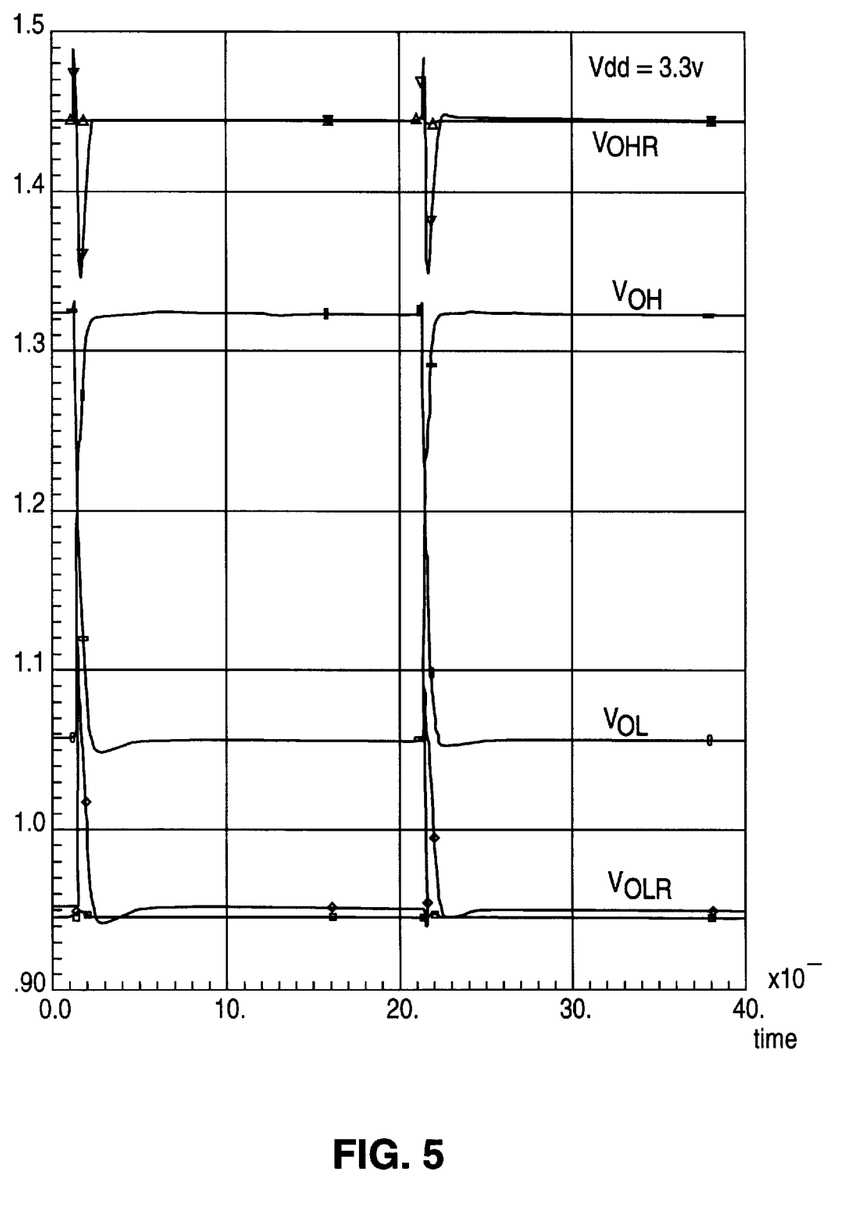
FIG. 5 illustrates a transient analysis of results of the low voltage differential signal driver circuit in accordance with one embodiment of the present invention.
Figure 6:
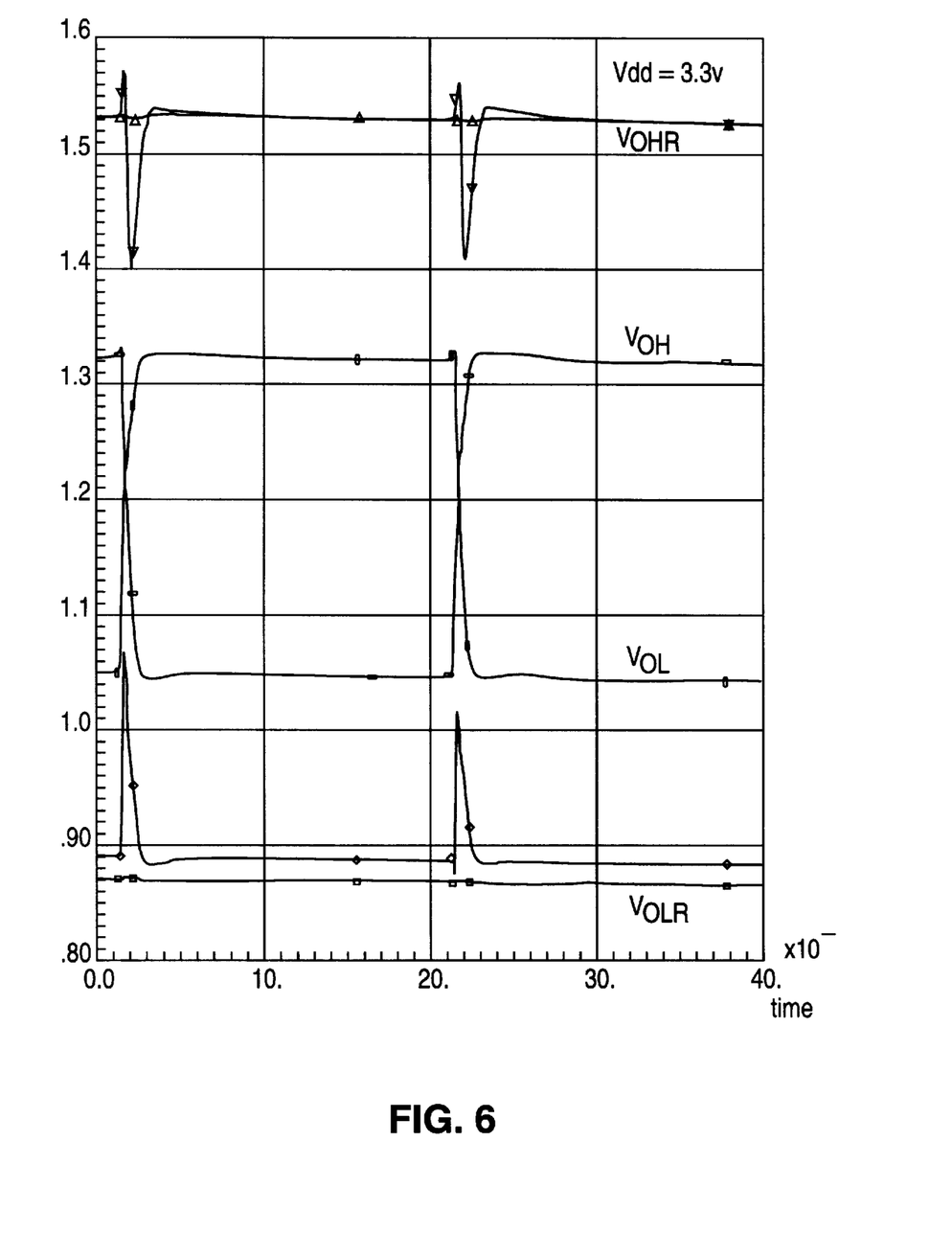
FIG. 6 illustrates a transient analysis of results of the low voltage differential signal driver circuit in accordance with another embodiment of the present invention.
Figure 7:
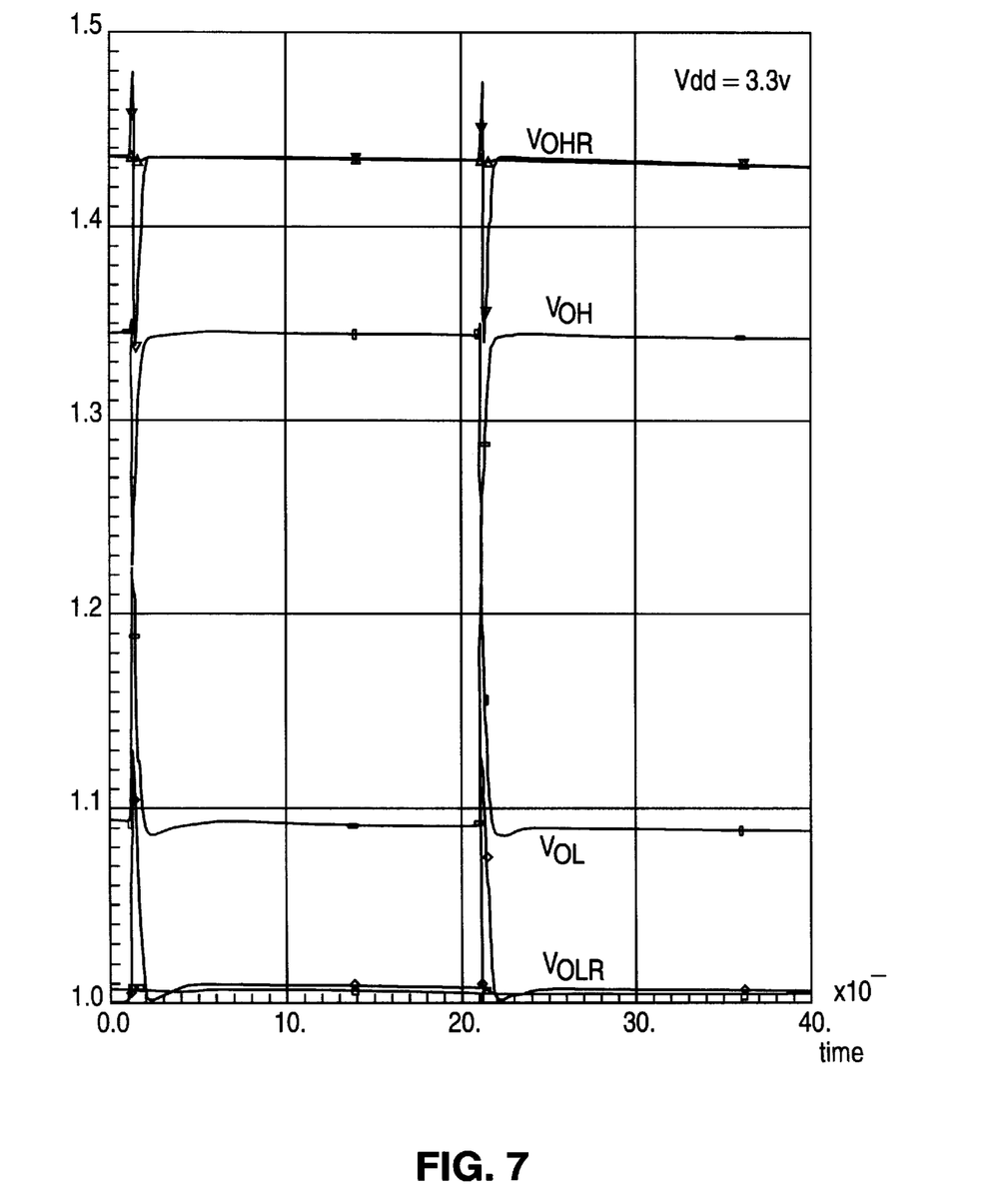
FIG. 7 illustrates a transient analysis of results of the low voltage differential signal driver circuit in accordance with yet another embodiment of the present invention.

FIG. 5 illustrates a simulated transient response of high output voltage reference VOHR signal at node ND1, high output voltage VOH signal at node 203 or 205 depending on which switching transistor N21, N22 is conducting, low output voltage VOL at node 203 or 205 depending on which switching transistor N23, N24 is conducting, and low output voltage reference VOLR at node ND6. This figure illustrates a typical simulated transient response at approximately 27° C. with voltage supply VDD at 3.3 volts and reference voltage VREF at 1.2 volts. The spikes in each of the four transient responses occur during the switching of transistors N21–N24. As can be seen, the voltage at nodes ND2 and COM remains virtually constant between the switching transitions. FIGS. 6 and 7 illustrate similar simulated resulting transient responses when the temperature is approximately 150° C. and −40° C., respectively.

Another advantage of LVDS driver 200 is the elimination of output impedance problems experienced by a conventional LVDS driver 100 (FIG. 1). The small signal analysis shown in FIGS. 5–7 illustrate that the voltages at nodes ND2 and COM remains constant between switching transitions. Therefore, these nodes ND2, COM are equivalent to the small signal analysis at circuit ground. The only output impedance in LVDS driver 200 is the impedance from switching transistors N21–N24. As a result, not only does LVDS driver 200 eliminate impedance mismatch, but the impedance of LVDS driver 200 is also much lower than that compared to a conventional LVDS driver circuit 100.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus including a line driver circuit for providing a differential signal to an external circuit, the line driver circuit comprising:

first and second output nodes configured to couple to an external circuit and convey first and second drive currents;

a current sourcing circuit configured to generate a third drive current;

a current steering circuit coupled to the current sourcing circuit at a first signal node and coupled to the first and second output nodes and configured to receive first and second input signals and in accordance therewith direct the third drive current in first and second directions to provide the first and second drive currents, wherein the first and second drive currents together form at the first and second output nodes a differential output signal;

a first regulating circuit coupled to the current sourcing circuit and to the current steering circuit;

a current sinking circuit coupled to the current steering circuit at a second signal node;

a second regulating circuit coupled to the current sinking circuit and to the current steering circuit; and a mimicking circuit coupled to the first and second regulating circuits and configured to provide a first reference signal to the first regulating circuit and a second reference signal to the second regulating circuit, wherein the first regulating circuit compares a first node signal at the first signal node with the first reference signal and when the first node signal transcends the first reference signal, controls the current sourcing circuit to source current to the current steering circuit to maintain a predetermined value of the differential output signal, and the second regulating circuit compares a second node signal at the second signal node with the second reference signal, and when the second node signal transcends the second reference signal, controls the current sinking circuit to sink current from the current steering circuit to maintain the predetermined value of the differential output signal.

2. The apparatus of claim 1, wherein the first and second regulating circuits comprise first and second operational amplifiers, respectively.

3. The apparatus of claim 1, wherein the current sourcing circuit comprises a current sourcing transistor and the current sinking circuit comprises a current sinking transistor.

4. The apparatus of claim 1, wherein the first reference signal comprises a high output voltage reference signal;

the second reference signal comprises a low output voltage reference signal;

the first node signal comprises a high output voltage signal having a high value which varies in relation to the differential output signal; and the second node signal comprises a low output voltage signal having a low value which varies in relation to the differential output signal.

5. The apparatus of claim 1, wherein the mimicking circuit comprises:

a mimicking current sourcing circuit for providing a mimicking drive current;

a first mimicking resistive circuit coupled to the mimicking sourcing circuit, wherein a first mimicking voltage drop across the first mimicking resistive circuit is proportional to a first driver voltage drop between the first signal node and the first output node;

a second mimicking resistive circuit coupled to the first mimicking resistive circuit, wherein a second mimicking voltage drop across the second mimicking resistive circuit is proportional to a second driver voltage drop between the first and second output nodes;

a third mimicking resistive circuit coupled to the second mimicking resistive circuit, wherein a third mimicking voltage drop across the third mimicking resistive circuit is proportional to a third driver voltage drop between the second node and the second signal node; and a mimicking current sinking circuit coupled to the second mimicking resistive circuit.

6. The apparatus of claim 5, wherein the mimicking drive current is proportional to a fraction of the third drive current.

7. The apparatus of claim 5, wherein the external circuit comprises a resistive load having an external load resistance coupled between the first and second output nodes.

8. The apparatus of claim 7, wherein the second mimicking resistive circuit comprises a first load resistive circuit in series with a second load resistive circuit, and wherein a sum of a resistance of the first load resistive circuit and the second load resistive circuit is proportional to the external load resistance.

9. The apparatus of claim 5, further comprising a third regulating circuit coupled to the mimicking current sinking circuit and the second mimicking resistive circuit and configured to compare a voltage within the second mimicking resistive circuit with a desired offset reference voltage, and when the voltage within the second mimicking resistive circuit transcends the desired offset reference voltage, the third regulating circuit controls the current sinking circuit to sink the mimicking drive current until the voltage within the second mimicking resistive circuit is proportional to the desired offset reference voltage.

10. The apparatus of claim 9, wherein the third regulating circuit comprises an operational amplifier.

11. An apparatus including a line driver circuit for providing a differential signal to an external circuit, the line driver circuit comprising:

first and second output nodes configured to couple to an external circuit and convey first and second drive currents;

a driver cell including a driver current sourcing circuit configured to generate a third drive current;

a driver current sinking circuit;

first and second transistors coupled between the driver current sourcing circuit and the driver current sinking circuit and configured to receive a first input signal and in accordance therewith direct the third drive current in a first direction to provide the first drive current;

third and fourth transistors coupled between the driver current sourcing circuit and the driver current sinking circuit and configured to receive a second input signal in accordance therewith direct the third drive current in a second direction to provide the second drive current, wherein the first and second drive currents together form at the first and second output nodes a differential output signal;

a first regulating circuit coupled to the current sourcing circuit at a first signal node;

a second regulating circuit coupled to the current sinking circuit at a second signal node; and a mimicking circuit including a mimicking current sourcing circuit coupled to the first regulating circuit and configured to provide a mimicking drive current, wherein a first mimicking voltage across the mimicking current sourcing circuit is proportional to a first driver voltage across the driver current sourcing circuit;

a first mimicking transistor coupled to the mimicking current sourcing circuit, wherein a second mimicking voltage across the first mimicking transistor is proportional to a second driver voltage across the first and fourth transistors;

a mimicking resistive circuit coupled to the first mimicking transistor, wherein a third mimicking voltage across the mimicking resistive circuit is proportional to a third driver voltage between the first and second output nodes;

a second mimicking transistor coupled to the mimicking resistive circuit and to the second regulating circuit, wherein a fourth voltage mimicking across the second mimicking transistor is proportional to a fourth driver voltage across the second and third transistors; and a mimicking current sinking circuit coupled to the second mimicking transistor, wherein a fifth mimicking voltage across the mimicking current sinking circuit is proportional to a fifth driver voltage across the current sinking circuit.

12. The apparatus of claim 11, wherein the first regulating circuit compares a first node signal at the first signal node with the first reference signal and in accordance therewith controls the sourcing circuit to source current to the current steering circuit to maintain a predetermined value of the differential output signal, and the second regulating circuit compares a second node signal at the second signal node with the second reference signal, and in accordance therewith controls the current sinking circuit to sink current from the current steering circuit to maintain the predetermined value of the differential output signal.

13. A method of maintaining a predetermined value of a differential output signal of a line driver circuit, the method comprising the steps of:

conveying first and second drive currents via first and second output nodes;

providing a third drive current by a current sourcing circuit via a first signal node;

directing the third drive current in first and second directions to provide the first and second drive currents to the first and second output nodes, wherein the first and second drive currents together form at the first and second output nodes a differential output signal;

sinking a portion of the third drive current by a current sinking circuit via a second signal node;

comparing a first node signal at the first signal node with a first reference signal, and in accordance therewith controlling the current sourcing circuit to source the third drive current to maintain a predetermined value of the differential output signal; and comparing a second node signal at the second signal node with a second reference signal, and in accordance therewith controlling the current sinking circuit to sink the portion of the third current to maintain the predetermined value of the differential output signal.

14. The method of claim 13, further comprising the step of:

providing a mimicking drive current proportional to the third drive current to a mimicking circuit and in accordance therewith generating the first and second reference signals.

* * * * *